(12) United States Patent
Maul

(10) Patent No.: US 6,535,273 B1
(45) Date of Patent: Mar. 18, 2003

(54) MICROLITHOGRAPHIC ILLUMINATION SYSTEM WITH DEPOLARIZER

(75) Inventor: Manfred Maul, Aalen (DE)

(73) Assignee: Carl-Zeiss-Stiftung (DE)

( * ) Notice: Subject to any disclaimer, the term of this patent is extended or adjusted under 35 U.S.C. 154(b) by 20 days.

(21) Appl. No.: 09/756,028

(22) Filed: Jan. 2, 2001

Related U.S. Application Data

(63) Continuation of application No. PCT/EP99/04212, filed on Jun. 17, 1999.

(30) Foreign Application Priority Data

Jul. 2, 1998 (DE) .......................... 198 29 612

(51) Int. Cl.⁷ .................. G03B 27/54; G03B 27/42; G03B 27/72
(52) U.S. Cl. .................. 355/67; 355/53; 355/71
(58) Field of Search .............. 355/52, 53, 65, 355/67–71; 359/364, 649, 679; 356/399–401

(56) References Cited

U.S. PATENT DOCUMENTS

| 3,744,876 A | * | 7/1973 | Kay et al. ............ 350/147 |
| 4,370,026 A | | 1/1983 | Dubroeucq et al. ..... 350/163 |
| 5,260,832 A | | 11/1993 | Togino et al. |
| 5,691,802 A | | 11/1997 | Takahashi ............ 355/53 |
| 6,169,627 B1 | * | 1/2001 | Schuster ............. 359/364 |
| 6,285,443 B1 | * | 9/2001 | Wangler et al. ....... 355/67 |
| 6,366,410 B1 | * | 4/2002 | Schultz et al. ....... 359/649 |

FOREIGN PATENT DOCUMENTS

| DE | 41 24 311 A1 | 7/1991 |
| DE | 196 37 563 A1 | 3/1998 |
| EP | 0 401 608 B1 | 5/1990 |
| EP | 0 747 772 A1 | 12/1996 |
| EP | 0 764 858 A2 | 3/1997 |
| JP | 406034915 A | * 2/1994 |
| JP | 10-125585 | * 5/1998 |

OTHER PUBLICATIONS

Wang, Baoliang "Bob", "Birefringence in fused silica and CaF2 for lithography", www.solid–state.com, Feb. 2000, Solid State Technology, pp. 77–82.
DD 281 011 A1, East German Republic Patent Document, Dr. Rolf Wetzel, Depolarizer, Jul. 25, 1980.
Jp 06020912, Japanese Patent Document, dated Apr. 20, 1994 and Jan. 28, 1994–not included but may be obtainable from PCT/EP99/04212 submitted to USPTO by WPO.

* cited by examiner

Primary Examiner—Henry Hung Nguyen

(57) ABSTRACT

An illumination system for microlithography, has an excimer laser with an emission wavelength, a beam expanding system, a light mixer system and an illumination plane. In the system, an optical element made of a double refracting material is arranged in a light beam cross-section (for example, a Hanle depolarizer) and the thickness of the element varies across the light beam cross-section by a multiple of the emission wavelength. At least one light mixer system is positioned downstream of the optical element. A pseudo-depolarizer having two wedge plates is positioned upstream of the optical element.

9 Claims, 3 Drawing Sheets

MICROLITHOGRAPHIC ILLUMINATION SYSTEM WITH DEPOLARIZER

CROSS-REFERENCE TO RELATED APPLICATIONS

This a continuation of PCT/EP99/04212 filed Jun. 17, 1999.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Technical Field

The invention relates to a microlithographic illumination system with an excimer laser having an emission wavelength, a beam expanding system, a light mixing system, and an illumination plane.

Such illumination systems are known in DUV microlithography with wavelengths of 248 nm, 193 mn, and 157 nm. Examples are described in European Patent Document EP 0 747 772.

In addition, the invention relates to a projection exposure device having an illumination system, a mask on a holding system, a projection objective, an exposure object on a support system, and a control and regulating system.

Use of a pseudo-depolarizer in such an illumination system is provided. The concept of pseudo-depolarizer makes it clear that these elements do not actually remove the polarization, but only bring about different polarization changes over the cross section of the pencil of rays, so that on the spatial average a preferred direction of polarization no longer exists.

2. Discussion of Relevant Art

Different pseudo-depolarizers are known from the literature:

The Hanle depolarizer, connected to a compensating wedge, is offered by the firm of Bernhard Halle Successors as an element for optical experiments.

German Patent Document DD 281 011 A1 describes a depolarizer consisting of a linear doubly refracting wedge and a circular doubly refracting second wedge for use in the UV region for measuring devices (spectrographs).

In Fuyun Xu, SPIE Vol. 1752 (1992), 307–310, various quartz depolarizers are described, including an arrangement of two wedges with crossed optical axes.

However, measures are not given for the superposition of the polarization distribution arising in these elements—all polarization directions geometrically adjacent—and it is assumed there that an integration is effected by a detector extending two-dimensionally in the measuring devices.

It is advantageous to use unpolarized light in microlithography, in order to obtain a structure transfer, which is independent of direction. In microlithographic systems with wavelengths below 300 nm, however, linearly polarized excimer lasers are preferably used as the light source. These are available for the wavelengths of 248 nm, 193 nm and 167 nm.

The use of a $\lambda/4$ plate, which produces circularly polarized light, is known for the production of light without a preferred direction of polarization. The requirements on the delay tolerance are very close there; for example, a delay error of $\lambda/100$ still causes a residual polarization of 6%. The production of delay plates with such close tolerances is expensive at short wavelengths and hence correspondingly costly. Furthermore, a close tolerance can only be maintained over a small temperature range.

SUMMARY OF THE INVENTION

The invention has as its object the technically simple and cost-effective production of light without a preferred direction of polarization in the image plane of microlithographic illumination systems, or of projection illumination devices. According to the invention, the object is attained by a microlithographic illumination system comprising an excimer laser with an emission wavelength, a beam expanding system, a light mixing system, an illumination plane, and an optical element of doubly refracting material arranged in the cross section of a pencil of rays, wherein the thickness of the optical elements varies by a multiple of the wavelength over the cross section of the pencil of rays, and at least one light mixing system is arranged after the optical element.

A delay element with locally defined different delays (pseudo-depolarizer) is thus used instead of a delay plate having very close tolerances, and uniformly unpolarized light is produced in the whole illuminated field by light-mixing components of the subsequent optics. The variation of the thickness can then take place over an arbitrary, but not integral, multiple of the emission wavelength. The production of unpolarized light has the further advantage in contrast to circularly polarized light that succeeding components causing unintended polarization changes cannot cause any reversion of the polarization state into unfavorable elliptically polarized light. This is particularly so for very short wavelengths.

According to the invention, the depolarizing element is a wedge, particularly a Hanle depolarizer. A lens of doubly refracting material could also be used, for example. Providing a second optical element which raises the average refractive effect of the optical element is important in practice; it avoids in particular a bending of the optical axis and resulting complications in the construction of mountings.

Advantageously, the microlithographic illuminating system further comprises a further optical element of doubly refracting material with circular double refraction or with an axis of double refraction rotated relative to the optical element of doubly refracting material. The refractive compensation is connected to increased depolarization.

Advantageously two light mixing systems are provided on two mutually optically conjugate planes, and thus ensure mixing and depolarization at each place in the further beam path.

Advantageously, the microlithographic projection illuminating system comprises an illumination system, a mask on a holding system, a projection objective, an exposure object on a support system, and a control and regulating system, wherein the illuminating system comprises a microlithographic illumination system according to the invention as described above. The types of objectives—purely refractive or catadioptric—are combined according to the invention described above.

Advantageously the catadioptric projection objective is of the axially symmetrical type, with central shadowing or of a modified Schupman achromat type.

Examples of refractive or catadioptric types of objectives as used in the invention are found in U.S. Pat. No. 5,260,832, German Patent DE 196 39 586, and U.S. Pat. No. 5,691,802.

BRIEF DESCRIPTION OF THE DRAWINGS

The invention will be explained in more detail with reference to the drawings.

DETAILED DESCRIPTION OF PREFERRED EMBODIMENTS

Figure 1:
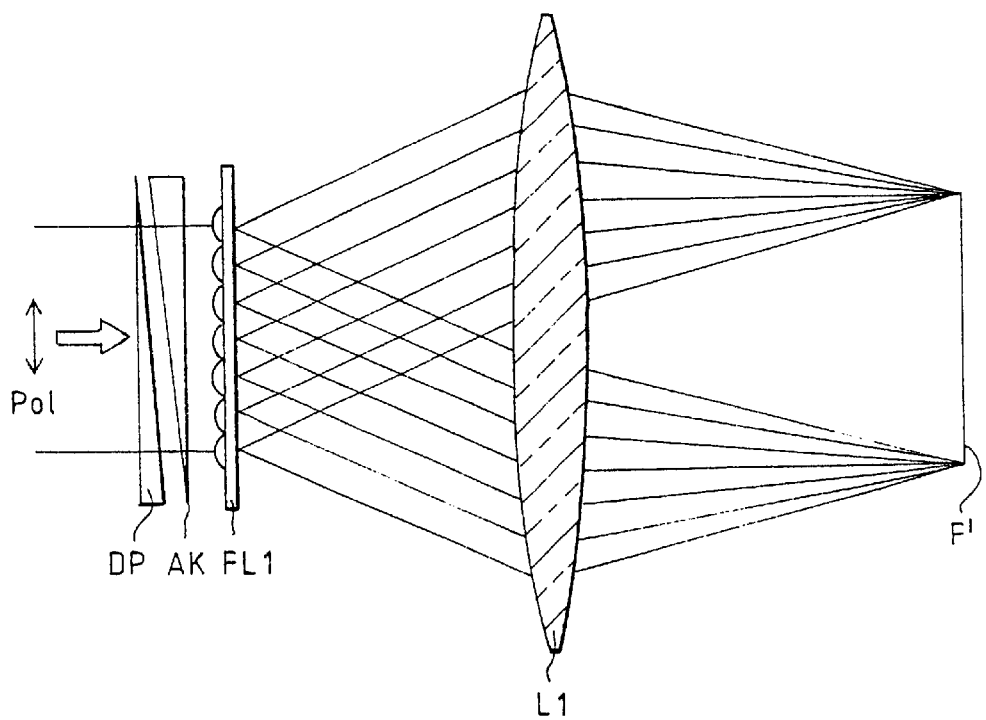
FIG. 1 shows schematically a slightly wedge-shaped delay plate as a depolarizer in the laser beam, with subsequent light mixing by numerous, mutually adjacent small lens elements.

As regards FIG. 1:

The pseudo-depolarizer DP used here consists of a quartz plate or other doubly refracting material, and has the form of a flat wedge. The crystal is cut so that light passing through the wedge undergoes an effect of double refraction. The optical axes are oriented at 45° to the direction of polarization of the light.

The emergent pencil of rays then has a polarization state which constantly changes along the wedge direction, and which is transformed from linearly polarized via circularly polarized into linearly polarized with a 90° reversal and oppositely circularly polarized, and so on. The locally different polarization states are completely superposed, by means of the following fly's eye lens and the condensing lens L1 behind it, in the rear focal plane F' of L1.

The slope of the wedge is preferably to be chosen so that several orders of optical delay are attained over the length of the wedge. The depolarizing effect is then only slightly dependent on the size (diameter) of the pencil of rays. An optimum effect is attained when the size of the pencil of rays is an exact multiple of the path on the wedge plate over which the delay changes by a wavelength. In this case, the light is completely depolarized at each location in the plane F'. The maximum residual degree of polarization which arises decreases rapidly with an increasing number of orders of delay. For example, if the change of delay over the size of the pencil of rays is greater than 4 wavelengths, the maximum residual degree of polarization which occurs is <4%, independent of the exact size of the pencil of rays.

A wedge AK of suitable, optically homogeneous transmissive material, following the wedge depolarizer in the beam path, serves to equalize the deflection of the pencil of rays by refraction at the wedge angle of the depolarizer DP. The wedge angle of the equalizing wedge AK is to be chosen so that, taking account of the average difference of refractive indices of both materials, the deflecting effect of the depolarizer DP is exactly compensated.

The wedge is the simplest form of an optical element with deferent thickness. Other forms, for example, step shapes or lens shapes, are however basically also suitable.

The desired depolarization is attained by the combined superposition, according to the invention, of the spatially separated different polarization states.

Instead of the single wedge pseudo-depolarizer, other embodiments of pseudo-depolarizers can also be used, such as those known, for example, from DD 281 011 A1 or the Fuyun Xu reference cited hereinabove. The use of a double wedge pseudo-depolarizer is particularly advantageous. With this there results, on average, no deflection of light due to refraction, and the number of orders of delay is doubled.

Figure 2A:
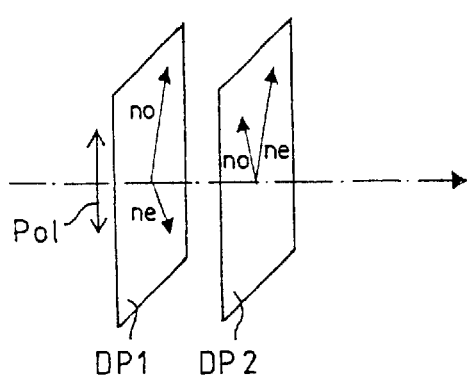
FIG. 2 shows schematically another embodiment of the delay element as a double wedge depolarizer.
Figure 2B:
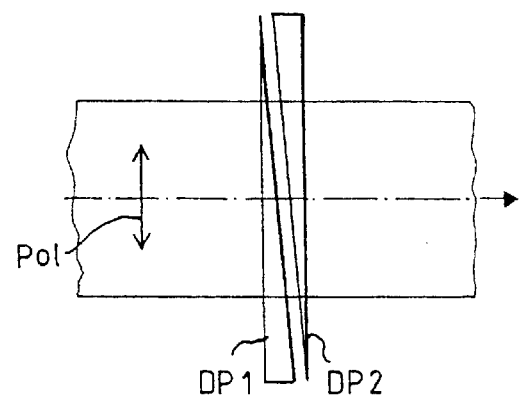

FIG. 2a shows schematically the orientation of the light direction L, polarization direction Pol, and the optical axes $n_o$, $n_e$ of the doubly refracting wedge plates DP1, DP2. FIG. 2b shows the beam path in a side view.

Figure 3:
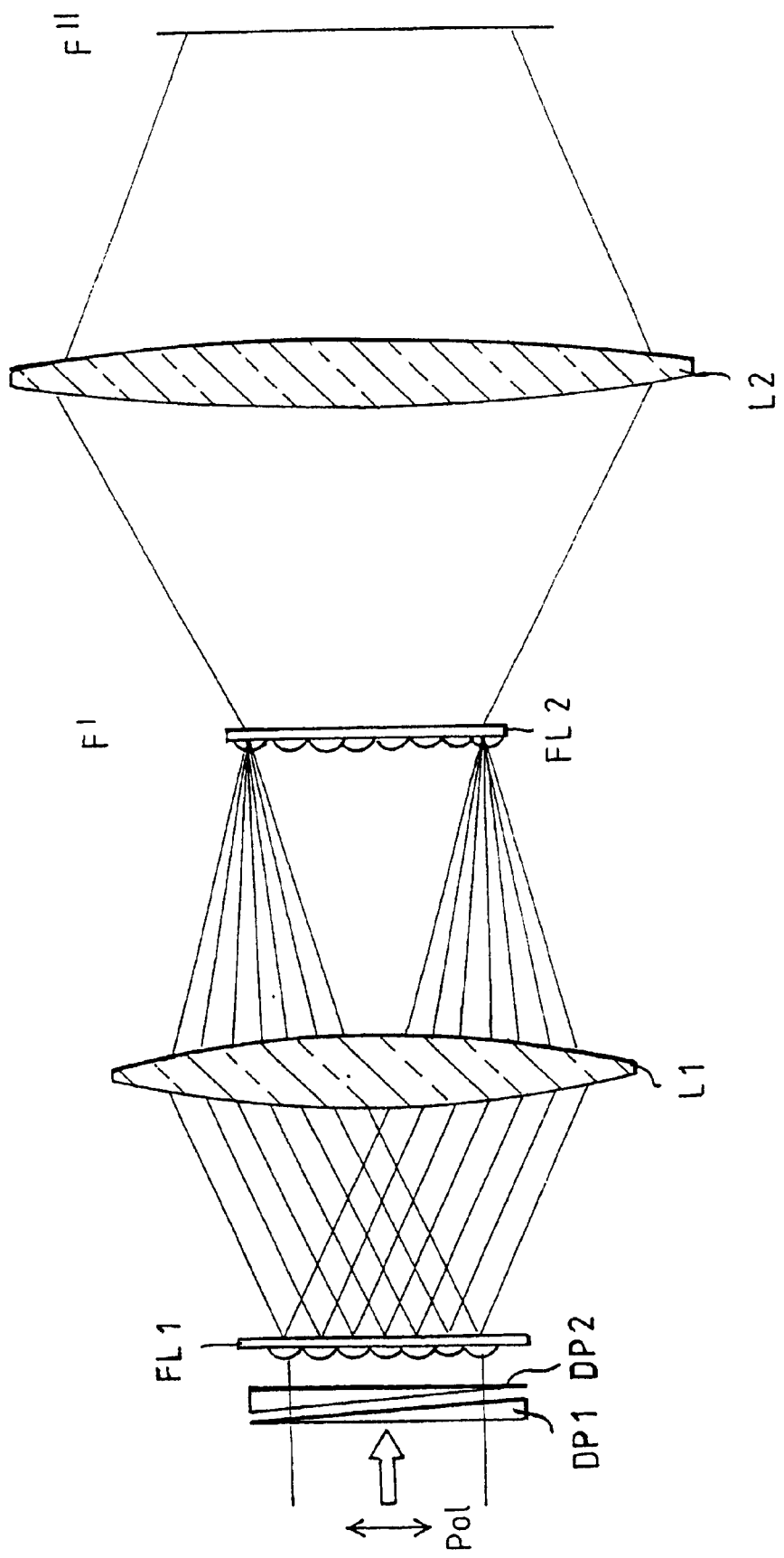
FIG. 3 shows schematically a single wedge depolarizer with subsequent light mixing by two light mixing elements, each containing numerous, mutually adjacent small lens elements, in two optically conjugate planes, for the production of unpolarized light at optional places in the optical system.

As regards FIG. 3:

By the portion DP, AK, FL1, L1 already mentioned in FIG. 1, optimum depolarization is attained only in the rear focal plane F' of the condensing lens L1. Optimum depolarization can also be attained for the F'' conjugate to F', and thus also in any other plane of the system, by introduction of a second fly's eye lens FL2 into the plane F' and a condensing lens L2 at the distance of its focal length behind it.

Other light-mixing systems (e.g., a glass rod) can be used instead of the fly's eye lenses FL1, F1, and the condensing lenses L1, L2.

The fly's eye lenses FL1 and F12 can be constructed discretely in a known manner as raster lenses or honeycomb lenses, cf. European Patent Document EP 0 401 608 B1 (89022 P), or else as honeycomb plates with microstructure technology, and also as binary optics, Fresnel array, and the like. Such components are useful as honeycomb condensers in microlithographic illumination systems.

An appropriate location for the pseudo-depolarizer is certainly at the beginning of the optical system, in the collimated but already expanded laser beam, so that all the components profit from the depolarization. It would however also be possible to locate the pseudo-depolarizer at any other place, for example, before the glass rod. A complete light mixing must still take place behind it.

Figure 4:
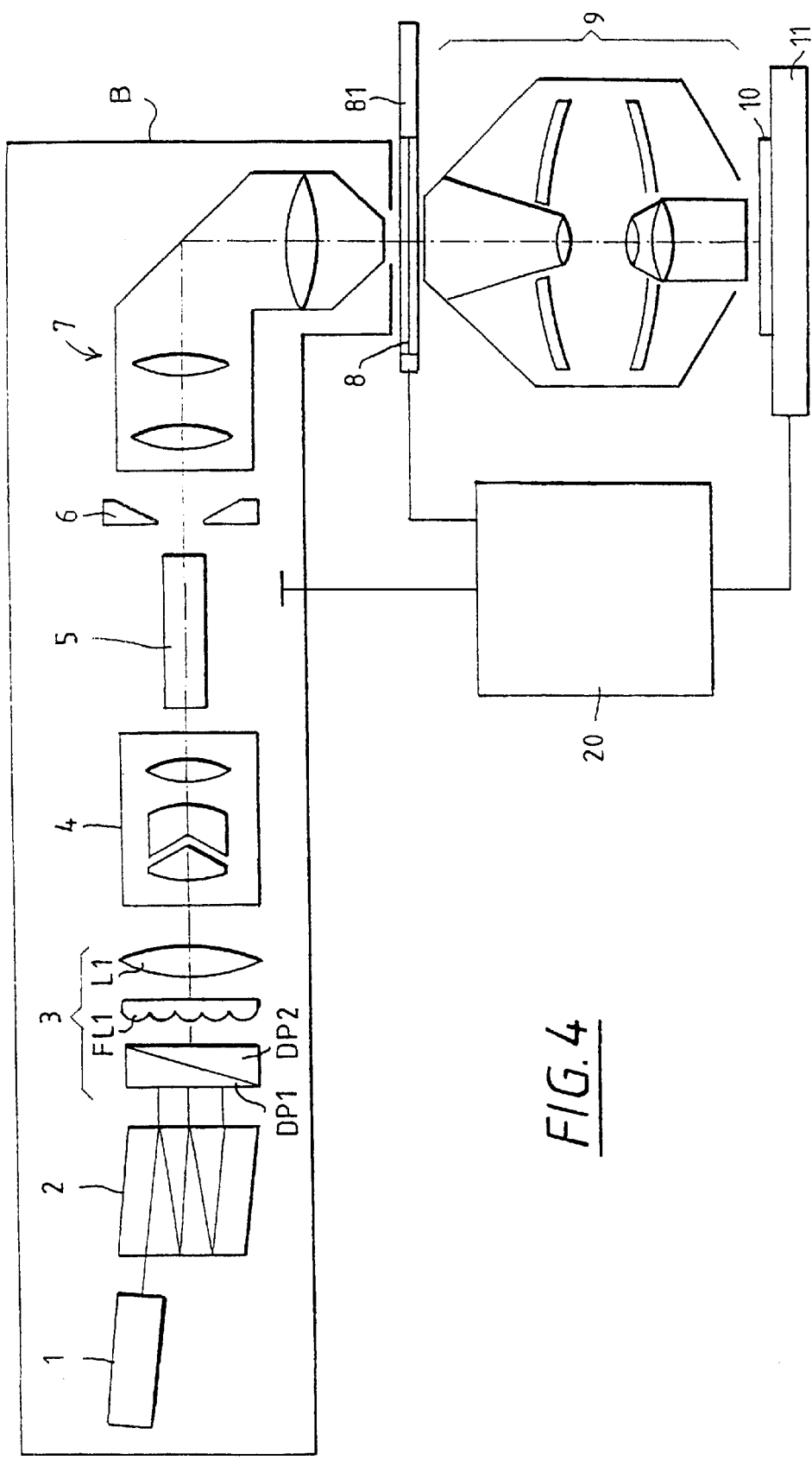
FIG. 4 shows schematically a projection exposure device according to the invention.

FIG. 4 shows for this purpose an example of a projection exposure device according to the invention.

B is the illuminating system, containing:

an excimer laser 1, for 248 nm, 193 nm or 157 nm, as a rule containing means for narrowing the bandwidth such as injection-locking, etalon, grating;

a beam expanding system 2, which produces from the narrow, rectangular cross section a wider, square or optimally round form, e.g., with a mirror box according to European Patent Document EP 0 401 608 B1 (89022 P) which also reduces coherence, or an anamorphic type of teloscope system, or with combinations of these;

a pseudo-depolarizer 3 with two wedge plates DP1 and DP2, raster lens plate FL1, and condensing lens L1 according to the description of FIGS. 1–3 hereinabove;

optionally, a zoom axicon group 4, such as known from European Patent Document EP 0 747 772 A (95023 P), for setting the kind of illumination;

a glass rod 5 as a light mixing element, also the function described in FIG. 3;

a reticle masking (REMA) system 6, a displaceable stop for setting the illuminated region on the mask (reticle, 8) (scan slit, or individual chip or the like in steppers);

a REMA objective 7 (cf. DE 196 53 983 A (96033 P)), which sharply images the reticle masking system 6 on the mask 8 and provides for homogeneous telecentric illumination;

as required, stops, graduated filters, diffractive optical elements and the like, in the region of the assemblies 1 through 7, e.g., for setting quadrupole illumination, uniformity correction, and the like.

The projection exposure device furthermore contains:

the mask 8 (reticle) with the structure to be imaged, on a holding system 81 for positioning and displacement in the step-and-repeat or scanning process;

the projection objective 9, here shown schematically as a catadioptric reduction objective of the coaxial kind according to German Patent DE 196 39 586 (96034 P);

the object (wafer) which is to be exposed in a structured manner, on an object table (wafer chuck) 11, which serves, similarly to the holding system 81, for exact positioning (autofocus, etc.) and for displacement in step-and-repeat or scanning.

The whole device is controlled and regulated in known manner by a computer system 20, in accordance with the structures and properties of the respective mask to be imaged.

This exemplary structure of a microlithographic projection exposure device can of course be modified in numerous ways. An important feature according to the invention is at least one doubly refracting optical element with varying thickness over the cross section, followed by a mixing element.

The Hanle depolarizer has the advantage here of having a simple form and also being very short in the light direction, rather differing from the Cornu depolarizer, which is also usable.

I claim:

1. A microlithographic illumination system comprising:

an excimer laser with an emission wavelength, a beam expanding system, an optical element of doubly refracting material arranged in a cross section of a pencil of rays, wherein the thickness of said optical element varies by a multiple of the emission wavelength over the cross section of the pencil of rays, at least one light mixing system arranged after said optical element and an illumination plane.

2. The microlithographic illumination system according to claim 1, wherein said optical element is a wedge.

3. The microlithographic illumination system according to claim 2, wherein said optical element comprises a Hanle depolarizer.

4. The microlithographic illuminating system according to claim 1, further comprising a second optical element that compensates the average refractive effect of said optical element of doubly refracting material.

5. The microlithographic illuminating system according to claim 1, further comprising a further optical element of doubly refracting material with circular double refraction, or with an axis of double refraction rotated relative to said optical element of doubly refracting material.

6. The microlithographic illuminating system according to claim 1, wherein a light mixing system is arranged in each of two mutually conjugate planes, especially wherein said light mixing system is arranged in a plane equivalent to the illumination plane and in a plane conjugate thereto.

7. A microlithographic projection exposure system comprising an illumination system, a mask on a holding system, a projection objective, an exposure object on a support system, and a control and regulating system, wherein said illuminating system comprises a microlithographic illumination system according to claim 1.

8. The microlithography projection exposure system according to claim 7, wherein the projection objective is refractive.

9. The microlithography projection exposure system according to claim 7, wherein said projection objective is catadioptric of the axially symmetrical type, with central obscuration or of a modified Schupman achromat type.

* * * * *